United States Patent
Asai et al.

[11] Patent Number: 6,073,334
[45] Date of Patent: Jun. 13, 2000

[54] TAPE CONNECTING METHOD, MEMBER, AND TOOL

[75] Inventors: Koichi Asai, Nagoya; Kunio Ooe, Chiryu; Yoshifusa Hyodo, Anjo, all of Japan

[73] Assignees: Fuji Machine Mfg. Co., Ltd., Chiryu; Meiwa Inc., Anjo, both of Japan

[21] Appl. No.: 09/108,243

[22] Filed: Jul. 1, 1998

[30] Foreign Application Priority Data

Jul. 22, 1997 [JP] Japan .................................. 9-195954

[51] Int. Cl.[7] .................................................. B21K 25/00
[52] U.S. Cl. ........................ 29/513; 29/432.1; 29/525.05; 428/61; 156/304.3; 24/703.5
[58] Field of Search ................... 156/92, 304.3; 428/61; 29/513, 525.05, 469.5, 505, 509, 432.1; 24/703.5, 703.1

[56] References Cited

U.S. PATENT DOCUMENTS

| | | | |
|---|---|---|---|
| 1,413,106 | 4/1922 | Dietze | 29/513 X |
| 2,506,933 | 5/1950 | Mercer | 156/92 X |
| 2,552,114 | 5/1951 | Reinhard | 156/92 X |
| 3,571,862 | 3/1971 | Zemek . | |
| 3,758,355 | 9/1973 | Witherow | 156/304.3 X |
| 3,853,654 | 12/1974 | Patton | 156/304.3 X |
| 5,142,733 | 9/1992 | Mogel et al. | 428/61 X |
| 5,320,694 | 6/1994 | Dietzsch | 156/304.3 X |

FOREIGN PATENT DOCUMENTS

| | | |
|---|---|---|
| 0 613 339 A1 | 8/1994 | European Pat. Off. . |
| 3311634 A1 | 10/1984 | Germany . |
| 92 11 415 U | 12/1993 | Germany . |
| A-5-259691 | 10/1993 | Japan . |
| A-6-100217 | 4/1994 | Japan . |
| 676703 A5 | 2/1991 | Switzerland . |

*Primary Examiner*—Mark A. Osele
*Attorney, Agent, or Firm*—Oliff & Berridge, PLC

[57] ABSTRACT

A method of connecting respective one end portions of two carrier tapes, to each other, each of the two tapes having accommodating pockets at a first pitch and tape-feed holes at a second pitch, each of the accommodating pockets accommodating an electric component, the method including the steps of aligning a tape connecting member which includes a flat main portion having tape-feed holes at a third pitch equal to the second pitch, and caulking projections projecting perpendicularly from the flat main portion, with the respective one end portions of the two tapes, such that tape-feed holes of the connecting member are aligned with respective tape-feed holes of the two tapes, causing at least two caulking projections of the connecting member to penetrate through respective thickness of the two tapes, so that the flat main portion of the connecting member contacts respective one major surfaces of the two tapes, and caulking respective portions of the two caulking projections that penetrate out of the respective other surfaces of the two tapes, so that the respective one end portions of the two tapes are connected to each other.

17 Claims, 9 Drawing Sheets

TAPE CONNECTING METHOD, MEMBER, AND TOOL

BACKGROUND OF THE INVENTION

1. Field of the Invention

The present invention relates to a method of connecting respective end portions of two component carrier tapes to each other and to a connecting member and a connecting tool which are used in carrying out the connecting method.

2. Related Art Statement

There is known a component carrier tape which has a plurality of component accommodating pockets at a first pitch along a first straight line, and has a plurality of tape-feed holes at a second pitch along a second straight line parallel to the first straight line. Each of the component accommodating pockets accommodates an electric component ("EC") therein. This carrier tape is fed at a feeding pitch equal to the first pitch, so that the ECs are supplied one by one from the accommodating pockets. The carrier tape which is wound around a tape reel or is stored in a tape storing member is drawn, starting with its initial portion, and is fed forward by a tape feeding device. When the carrier tape is consumed to its terminal end portion, an operator connects the terminal end portion of the consumed carrier tape to an initial end portion of a new carrier tape, so that the ECs are successively supplied from the new tape following the prior tape.

Conventionally, one or more adhesive tapes and/or a tape connecting chip have or has been used to connect two carrier tapes. In a first case where each of two carrier tapes is a paper-based tape which includes (A) a component accommodating tape consisting of (a1) a card-based main tape having a number of through-holes formed through the thickness thereof, and (a2) a bottom tape adhered to a back surface of the main tape, and (B) a top tape which is adhered to a top surface of the main tape to close respective upper openings of the through-holes, usually, the respective component accommodating tapes of the two carrier tapes are connected to each other with an adhesive tape, and respective top tapes of the two carrier tapes are connected to each other with another adhesive tape. Meanwhile, in a second case where each of two carrier tapes is an embossed-type tape which includes (A) a component accommodating tape which is provided by a synthetic-resin-based tape having a number of embossed portions in a lengthwise direction thereof, and (B) a top tape which is adhered to a top surface of the component accommodating tape to close respective upper openings of the embossed portions, usually, the respective accommodating tapes of the two carrier tapes are connected to each other with a metal chip as a tape connecting chip, and respective top tapes of the two carrier tapes are connected to each other with an adhesive tape. The metal chip is provided by an elongate metal plate having a plurality of tape-feed holes at a pitch equal to the pitch of the tape-feed holes of each carrier tape. The metal chip has a plurality of connecting holes each of which is formed by burring at a location between a corresponding pair of adjacent tape-feed holes and has a burr resulting from the burring. The operator connects the two accommodating tapes by pressing the chip against those tapes and thereby causing the burrs of the chip to bite into the tapes.

In the above-described first case, however, the two paper-based tapes may not be connected to each other with a sufficiently great connecting strength, or the respective end portions of the two tapes may be connected to each other such that one of the tape-feed holes of the connected end portions has an irregular pitch different from the regular pitch of each tape. That is, the two tapes cannot be connected to each other with a sufficiently high reliability. Meanwhile, in the above-described second case, the two embossed-type tapes can be connected to each other with a somewhat higher reliability. However, in a third case where two paper-based tapes are connected to each other using a metal chip, those two tapes cannot be connected to each other with a satisfactory reliability. Thus, the third case is not practical. The metal chip is needed to include a thin main portion which is elastically deformable with a carrier tape. Accordingly, it is difficult to form burrs each of which projects from the thin main portion so as to have a sufficient length or height. On the other hand, in the case where a metal chip having short burrs is caused to bite into the two paper-based tapes, the two tapes cannot be connected to each other with a sufficiently great strength.

SUMMARY OF THE INVENTION

It is therefore an object of the present invention to provide the art of connecting two tapes to each other with a satisfactory reliability irrespective of what sort of tapes they are.

The present invention provide a tape connecting method, a tape connecting member, and a tape connecting tool which have one or more of technical features which are described below in respective paragraphs given parenthesized sequential numbers (1) to (18). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a method of connecting respective one end portions of a first carrier tape and a second carrier tape, to each other, each of the first and second carrier tapes having a plurality of component accommodating pockets at a first pitch along a first straight line, and having a plurality of tape-feed holes at a second pitch along a second straight line parallel to the first straight line, each of the component accommodating pockets accommodating an electric component therein, the method comprising the steps of: aligning a tape connecting member which includes (a) a flat main portion having a plurality of tape-feed holes at a third pitch equal to the second pitch, and (b) a plurality of caulking projections projecting from the flat main portion in a direction perpendicular thereto, with the respective one end portions of the first and second carrier tapes, such that at least one first hole of the tape-feed holes of the tape connecting member is aligned with at least one of the tape-feed holes of the first carrier tape and at least one second hole of the tape-feed holes of the tape connecting member is aligned with at least one of the tape-feed holes of the second carrier tape, causing at least one first projection of the caulking projections of the tape connecting member to penetrate through a thickness of the first carrier tape, and at least one second projection of the caulking projections to penetrate through a thickness of the second carrier tape, so that the flat main portion of the tape connecting member contacts one of opposite surfaces of the first carrier tape and one of opposite surfaces of the second carrier tape, and caulking respective portions of the first and second projections that penetrate out of the respective other surfaces of the first and second carrier tapes, so that the respective one end portions of the first and second carrier tapes are connected to each other. In the present method, the caulking projections of the tape connecting member penetrate through the two carrier tapes, so that the main portion of the connecting member contacts respective one surfaces of the two carrier tapes, and respective portions of the caulking projections that penetrate out of the respective other surfaces of the two tapes are caulked. Thus, the respective end portions of the two carrier tapes are connected to each other. Not only two embossed-type carrier tapes but also two paper-based carrier tapes can be connected to each other with a sufficiently high reliability. Each of the caulking projections can have so great a length or height that each caulking projection can penetrate though the thickness of each tape and a portion of the each projection that penetrates out of the other surface of the each tape can be caulked. Thus, even the paper-based tapes can be connected to each other with a sufficiently great strength.

(2) According to a second feature of the present invention which includes the first feature (1), the tape-feed holes of the each of the first and second carrier tapes are formed in one of widthwise opposite end portions of the each carrier tape, and wherein a width of the tape connecting member is not greater than double a distance between a center of each of the tape-feed holes and one of widthwise opposite end edges of the each carrier tape that is nearer to the center of the each tape-feed hole than the other end edge. Since the width of the tape connecting member is so small, the connecting member may have a great thickness while it maintains the ability of being deformed to follow the carrier tapes. If the connecting member has a great thickness, the caulking projections can have a sufficiently great strength, even in the case where the projections are formed by bending respective portions of the connecting member relative to a remaining portion of the same.

(3) According to a third feature of the present invention, there is provided a tape connecting member for connecting respective one end portions of a first tape and a second tape, to each other, each of the first and second tapes having a plurality of tape-feed holes at a first pitch, comprising a flat main portion which has a plurality of tape-feed holes at a second pitch; and a plurality of caulking projections which project from the flat main portion in a direction perpendicular thereto. The present tape connecting member may be used in carrying out the tape connecting method according to the first or second feature (1) or (2).

(4) According to a fourth feature of the present invention which includes the third feature (3), the tape connecting member is formed of a metal plate, and the caulking projections are formed by bending a plurality of portions of the metal plate such that the bent portions are perpendicular to a remaining portion of the metal plate. This tape connecting member can be produced with ease and at low cost.

(5) According to a fifth feature of the present invention which includes the third or fourth feature (3) or (4), the caulking projections comprise a plurality of first caulking projections which are arranged in a widthwise direction of the main flat portion, and a plurality of second caulking projections which are arranged in the widthwise direction of the flat portion and which are apart from the first caulking projections in a lengthwise direction of the flat portion. The present tape connecting member has the plurality of first or second caulking projections which are arranged in the widthwise direction of the main portion, and each of the first or second caulking projections may have a small width to be easily caulked. Thus, the two tapes can be connected to each other with a sufficiently great strength. In addition, the present tape connecting member may have a length smaller than that of a different tape connecting member which has the same number of caulking projections arranged in a single array in a lengthwise direction thereof.

(6) According to a sixth feature of the present invention which includes any one of the third to fifth features (3) to (5), the caulking projections comprise at least one Y-shaped projection including a bifurcated free end portion. When the bifurcated free end portion of the Y-shaped projection is caulked by a plane or flat pressing surface, the bifurcated portion is bent such that the distance between the two branches or arms thereof increases, i.e., the bifurcated portion is opened outward. Thus, the Y-shaped projection is effectively prevented from coming off the first or second tape, and the two tapes are connected to each other with increased connecting strength.

(7) According to a seventh feature of the present invention which includes any one of the third to sixth features (3) to (6), the caulking projections comprise at least one inverted-J-shaped projection including a curved free end portion which is curved in a direction having a component parallel to a widthwise direction of the main portion. When the curved free end portion of the inverted-J-shaped projection is caulked by a flat pressing surface, the curved portion is bent in the having the component parallel to the widthwise direction of the main portion. Thus, the inverted-J-shaped projection is effectively prevented from coming off the first or second tape, and the two tapes are connected to each other with increased connecting strength.

(8) According to an eighth feature of the present invention which includes the seventh feature (7), the inverted-J-shaped projection has a recess formed in one of widthwise opposite end portions thereof, and a free end edge inclined with respect to the widthwise direction thereof such that one of opposite ends of the free end edge on a side of the one end portion is more distant from the main portion than the other end of the free end edge on a side of the other end portion. The curved portion of the inverted-J-shaped projection is defined by the recess and the free end edge. The curved portion of the projection may be provided within a range corresponding to the width of a remaining portion of the projection. In this case, when the inverted-J-shaped projection penetrates through the first or second tape, an unnecessarily large hole is not formed in the tape. Thus, the accuracy of connecting of tapes is not lowered. In addition, since the width of the curved portion is smaller than that of the remaining portion, the curved portion can easily be caulked.

(9) According to a ninth feature of the present invention which includes any one of the third to eighth features (3) to (8), the caulking projections comprise two inverted-J-shaped projections which include respective curved free end portions which are curved in respective directions having respective components which are opposite to each other.

(10) According to a tenth feature of the present invention which includes the ninth feature (9), the respective curved free end portions of the two inverted-J-shaped projections are curved in the respective directions toward each other. Alternatively, the curved free end portions of the two inverted-J-shaped projections may be curved in the respective directions away from each other.

(11) According to an eleventh feature of the present invention which includes any one of the third to eighth features (3) to (10), the flat main portion has an elongate shape, and the tape-feed holes comprise three tape-feed holes and the caulking projections comprise at least four caulking projections including two projections which project from lengthwise opposite end portions of the elongate main portion, respectively, and two projections one of which projects from a first intermediate portion of the main portion between one pair of adjacent holes of the three tape-feed holes and the other of which projects from a second intermediate portion of the main portion between the other pair of adjacent holes of the three tape-feed holes. In the case where the tape connecting member has three tape-feed holes, the connecting member may connect the two tapes to each other such that one end hole out of the three holes is aligned with one of the tape-feed holes of one tape and the other end hole is aligned with one of the tape-feed holes of the other tape. In this case, each of the respective end portions of the two tapes to be connected is cut along a straight line passing through a center of one tape-feed hole thereof, and the middle hole of the three holes is aligned with the respective half tape-feed holes of the respective end portions of the two tapes. Therefore, the two pairs of projections which project from the first and second intermediate portions of the main portion, respectively, penetrate through an intermediate portion between the half hole and its adjacent full hole of one tape and an intermediate portion between the half hole and its adjacent full hole of the other tape, respectively. Therefore, even if the connecting member may have a small length, it can connect the two tapes with a sufficiently great strength. So long as the tape connecting member can connect two tapes with a sufficiently great strength, the shorter the better, because the shorter connecting member can smoothly be fed with the tapes and can be produced at low cost. A tape connecting member which has only two tape-feed holes is the shortest. In this case, each of the respective end portions of the two tapes to be connected is cut along a straight line passing through an intermediate portion between a pair of adjacent tape-feed holes thereof, and accordingly the distance between the end edge and its adjacent full hole of each tape is so short that it is difficult to cause the two intermediate pairs of caulking projections to penetrate into the tapes. Thus, it is preferred that the tape connecting member have three tape-feed holes.

(12) According to a twelfth feature of the present invention which includes any one of the third to eleventh features (3) to (11), the flat main portion has an elongate shape, and the tape-feed holes comprise three tape-feed holes and the caulking projections comprise eight caulking projections including four projections two of which project from one of lengthwise opposite end portions of the elongate main portion and the other two of which project from the other lengthwise end portion of the elongate main portion, and including four projections two of which project from a first intermediate portion of the main portion between one pair of adjacent holes of the three tape-feed holes and the other two of which project from a second intermediate portion of the main portion between the other pair of adjacent holes of the three tape-feed holes.

(13) According to a thirteenth feature of the present invention which includes any one of the third twelfth features (3) to (12), the flat main portion has an elongate shape, and the caulking projections comprise at least four caulking projections including (a) two Y-shaped projections each of which includes a bifurcated free end portion and which project from lengthwise opposite end portions of the elongate main portion, respectively, and (b) two inverted-J-shaped projections each of which includes a curved free end portion which is curved in a direction having a component parallel to a widthwise direction of the elongate main portion and which project from two intermediate portions of the main portion, respectively, which are apart from each other in a lengthwise direction thereof. In this tape connecting member, the two Y-shaped projections may be caulked in opposite directions, respectively, and the two inverted-J-shaped projections may be caulked in opposite directions, respectively. In this case, tests have proved that the amount of relative movement between the tape connecting member and each of the two tapes is minimized. This advantage is maximized in the case where the caulking projections comprise two pairs of Y-shaped projections each pair of which are arranged in the widthwise of the elongate main portion, and four inverted-J-shaped projections each pair of which are arranged in the widthwise of the main portion such that the respective curved end portions thereof are curved toward each other.

(14) According to a fourteenth feature of the present invention which includes any one of the third to thirteenth features (3) to (13), the flat main portion has an elongate shape, and wherein the caulking projections comprise eight caulking projections including (a) four Y-shaped projections each of which includes a bifurcated free end portion, two of which project from one of lengthwise opposite end portions of the elongate main portion, and the other two of which project from the other lengthwise end portion of the main portion, and including (b) four inverted-J-shaped projections each of which includes a curved free end portion which is curved in a direction having a component parallel to a widthwise direction of the elongate main portion, two of which project from one of two intermediate portions of the main portion which are apart from each other in a lengthwise direction thereof, and the other two of which project from the other intermediate portion of the main portion.

(15) According to a fifteenth feature of the present invention which includes the thirteenth feature (13), the tape-feed holes comprise three tape-feed holes, wherein one of the two inverted-J-shaped projections projects from a first intermediate portion of the elongate main portion between one pair of adjacent holes of the three tape-feed holes and the other inverted-J-shaped projection projects from a second intermediate portion of the main portion between the other pair of adjacent holes of the three tape-feed holes, and wherein one of the two Y-shaped projections is distant from the one inverted-J-shaped projection by a distance equal to the second pitch and the other Y-shaped projection is distant from the other inverted-J-shaped projection by the distance equal to the second pitch.

(16) According to a sixteenth feature of the present invention, there is provided a tape connecting tool for connecting respective one end portions of a first tape and a second tape, to each other, each of the first and second tapes having a plurality of tape-feed holes at a predetermined pitch, comprising a pair of pressing plates having respective pressing surfaces which are opposed to each other; a pressing mechanism which supports the two pressing plates such that the two pressing plates are movable toward, and away from, each other and which moves the respective pressing surfaces of the two pressing plates toward opposite surfaces of each of the respective one end portions of the first and second tapes, respectively; a plurality of positioning projections which project, in an array, from one of the respective pressing surfaces of the two pressing plates, and which fit in at least one of the tape-feed holes of the first tape and at least one of the tape-feed holes of the second tape and thereby position the first and second tapes relative to one of the two pressing plates which has the one pressing surface; and a plurality of receiving holes which are formed in the other pressing surface such that the receiving holes are opposed to the positioning projections, respectively, and which receive the positioning projections, respectively, which pass through the respective tape-feed holes of the first and second tapes, when the two pressing plates are moved toward each other by the pressing mechanism. When an operator uses the present tape connecting tool to connect the respective end portions of the two tapes to each other, first, the operator may set, on the tool, the tape connecting member according to any one of the third to fifteenth features (3) to (15), and then he or she inserts one or more positioning projections into one or more tape-feed holes of each of the respective end portions of the two tapes, so as to position the two end portions relative to each other. In this state, the operator operates the pressing mechanism to move the two pressing plates toward each other. Thus, the flat main portion of the tape connecting member is moved toward the two tapes, and the caulking projections of the connecting member penetrate through the tapes and are pressed against the pressing surface of the other pressing plate opposed to the one pressing plate from which the positioning projections project. In this state, if the operator further moves the two pressing plates toward each other, the main portion of the connecting member is further moved toward the two tapes and accordingly the caulking projections are caulked as such by the pressing surface of the other pressing plate. Eventually, the main portion of the connecting member is brought into close contact with the respective one surfaces of the two tapes. In this state, respective portions of the caulking projections which penetrate out of the respective other surfaces of the two tapes are completely caulked, so that the connecting member is effectively prevented from coming off the tapes. Thus, the two tapes are strongly connected to each other. Though respective free end portions of the positioning projections pass through, and project from, the respective other surfaces of the two tapes, those end portions are received in the receiving holes formed in the pressing surface of the other pressing member. Thus, the two pressing plates are safely allowed to move toward each other.

(17) According to a seventeenth feature of the present invention which includes the sixteenth feature (16), the pressing mechanism comprises a first lever having an elongate shape; a second lever including a first member, a second member, and a first axis member which connects the first and second members to each other such that the first and second members are pivotable relative to each other about the first axis member; a second axis member which extends parallel to the first axis member at a position distant from the first axis member in a lengthwise direction of the first lever and which connects the first lever and the first member to each other such that the first lever and the first member are pivotable relative to each other about the second axis member; the first lever and the second member including respective fulcrum-defining portions which, when one of opposite end portions of the second member that is opposite to the other end portion thereof connected by the first axis member to the first member, and a corresponding one of opposite end portions of the first lever are moved toward each other, engage each other to define a fulcrum for the first and second members of the second lever to be pivoted relative to each other about the first axis member; and the two pressing plates being attached to one of opposite end portions of the first member that is opposite to the other end portion thereof connected by the first axis member to the second member, and the other end portion of the first lever, respectively. In this pressing mechanism, one of opposite end portions of the second member that is opposite to the other end portion thereof connected to the first member, and a corresponding one of opposite end portions of the first lever function a pair of handle portions. When the operator applies a force to the pair of handle portions to move them toward each other, the pair of fulcrum-defining portions engage each other to define a fulcrum for the first and second members of the second lever to be pivoted relative to each other. Thus, the first member is pivoted about the second axis member, and accordingly one of opposite end portions of the first member that is opposite to the other end portion thereof connected to the second member is moved toward the other end portion of the first lever. Since the two pressing plates are attached to the one end portion of the first member and the other end portion of the first lever, respectively, those pressing plates are moved toward each other. Thus, in the present tape connecting tool, when the first and second members of the second lever are pivoted relative to each other, the two pressing plates are moved toward each other. Therefore, it is not needed to couple the first and second levers to each other via an axis member such that the two levers cross each other at the axis member. Thus, each of the two levers is easily provided by a hollow member which is formed of a considerably thin plate and has a considerably high rigidity.

(18) According to an eighteenth feature of the present invention which includes the sixteenth or seventeenth feature (16) or (17), the tape connecting tool further comprises at least one tape hold-down member which is provided on the one pressing surface from which the positioning projections project, the tape hold-down member elastically holding down the first and second tapes against the one pressing surface. In this case, after the operator sets the respective end portions of the two tapes on one pressing plate such that those end portions are positioned by the positioning projections projecting from the one pressing plate, he or she uses the two tape hold-down members to hold down the two end portions, respectively, against the one pressing surface. Thus, the operator can easily set the respective end portions of two tapes on the tape connecting tool. It is preferred to employ two tape hold-down members so that the two hold-down members hold down the respective end portions of two tapes against the one pressing surface. However, even in the case where the tape connecting tool employs only one tape hold-down member which holds down only one of the two end portions, the operator can enjoy the advantage to some extent.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described respective preferred embodiments of the tape connecting method, the tape connecting member, and the tape connecting tool of the present invention, by reference to the drawings.

Figure 1:
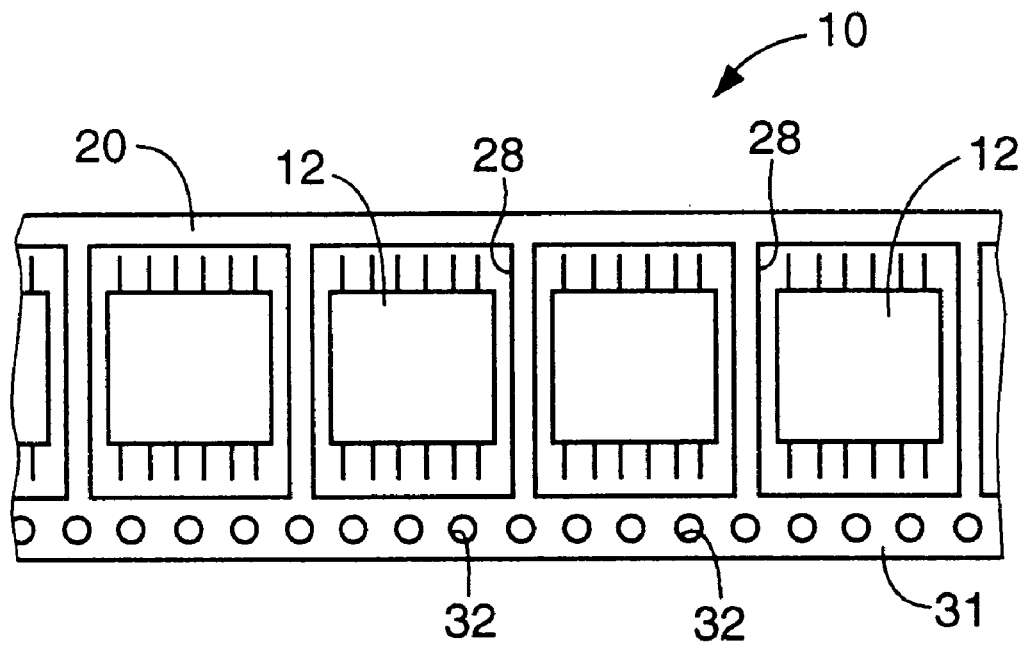
FIG. 1 is a plan view of an electric-component ("EC") carrier tape which is connected to another EC carrier tape by a tape connecting method as an embodiment of the present invention.
Figure 2:
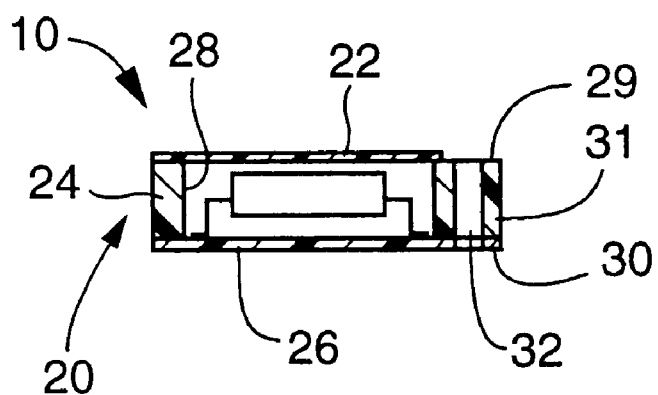
FIG. 2 is a transverse cross-sectioned view of the EC carrier tape of FIG. 1.
Figure 3:
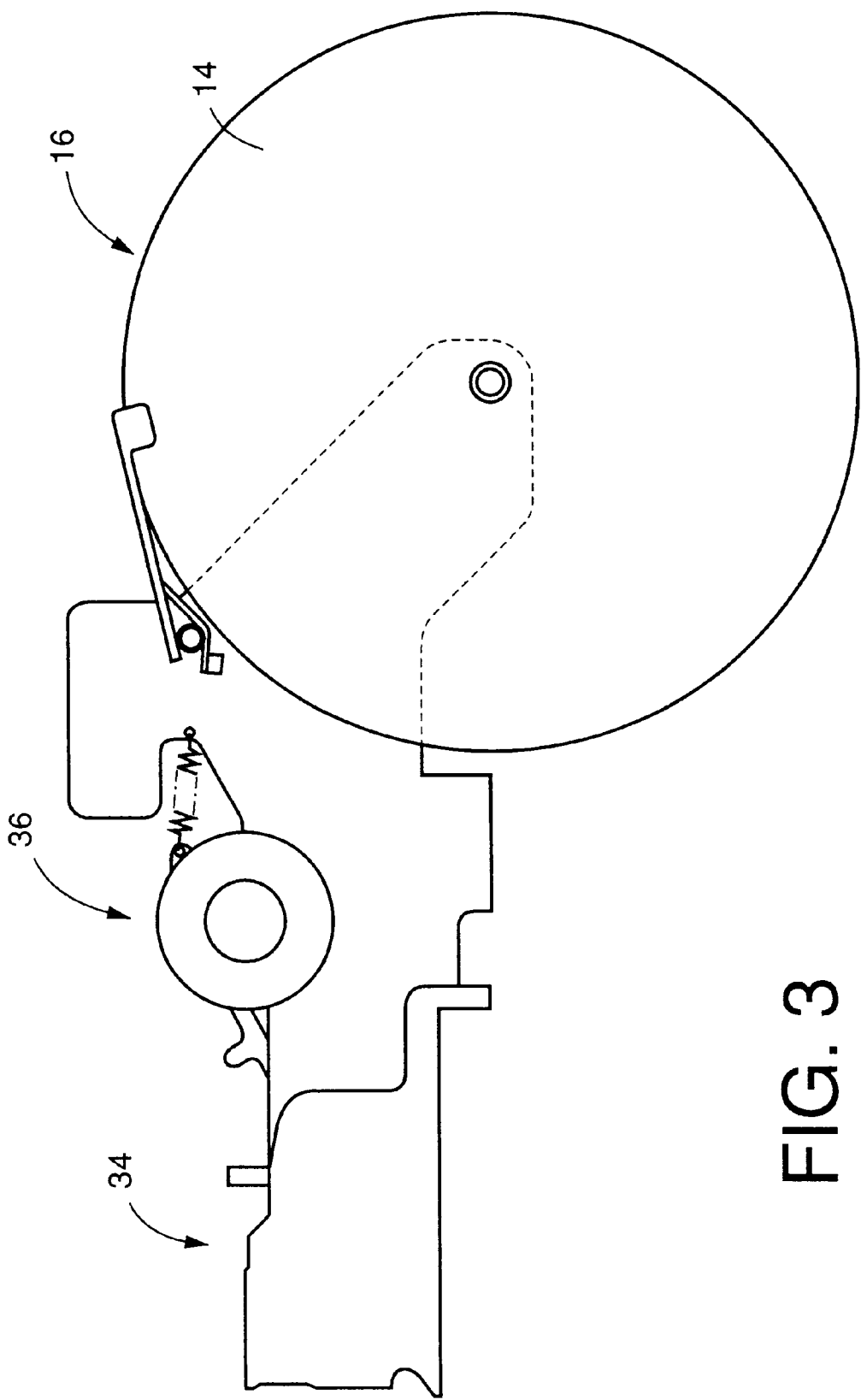
FIG. 3 is a schematic view of a EC supplying device which holds and feeds the EC carrier tape of FIG. 1.
Figure 11:
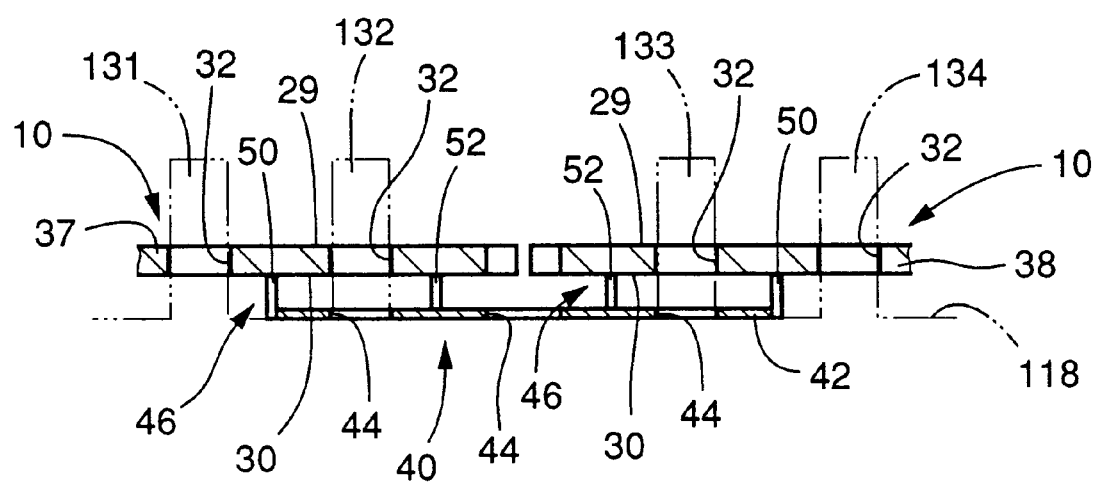
FIG. 11 is a cross-sectioned, side elevation view showing the state in which the two EC carrier tapes each shown in FIG. 1 and the tape connecting member of FIG. 4 are positioned relative to the tape connecting tool of FIG. 9.

In FIGS. 1 and 2, reference numeral 10 designates an electric-component ("EC") carrier tape which carries a number of SO packages 12 each as a sort of electric component ("EC"). Each SO package 12 is a flat package which has lead wires projecting laterally from each of two opposite side surfaces thereof. The EC carrier tape 10 is wound around a tape reel 14, shown in FIG. 3, which is held by a tape holding device 16. The EC carrier tape 10 includes a EC accommodating tape 20 and a top tape 22 which cooperate with each other to carry the SO packages 12. The EC accommodating tape 20 includes a main tape member 24 formed of card, and a bottom tape member 26 adhered to the back surface of the main tape member 24. The main tape member 24 has, in a widthwise middle portion thereof, a number of through-holes formed through a thickness thereof, at a regular pitch in a lengthwise direction thereof. The bottom tape member 26 closes respective lower openings of the through-holes of the main tape member 24, thereby defining a number of EC accommodating pockets 28 at the regular pitch. Each EC accommodating pocket 28 accommodates one SO package 12. The top tape 22 is adhered to a top surface 29 of the EC accommodating tape 20, thereby closing respective upper openings of the EC accommodating pockets 28. In addition, the EC accommodating tape 20 has, in one 31 of widthwise end portions thereof which is elongate parallel to a lengthwise direction thereof, an array of tape-feed holes 32 which are formed through a thickness thereof between the top surface 29 and a back surface 30 thereof, at a regular pitch in the lengthwise direction thereof. A tape feeding device 34 feeds the EC carrier tape 10 at a predetermined feeding pitch in a tape feeding direction, and a top-tape peeling device 36 peels the top tape 22 from the EC accommodating tape 20. The leading one of the EC accommodating pockets 28 from which the top tape 22 has been peeled is fed to an EC pick-up position where the SO package 12 accommodated in the leading pocket 28 is picked up by a vacuum-suction nozzle of a EC-suction head (not shown). This is the EC supplying operation. When the EC supplying operation advances and the EC carrier tape 10 comes to its end, an operator supplies a new EC carrier tape 10. First, the operator detaches the tape reel 14 on which the tape 10 is coming to its end, and subsequently attaches a new tape reel 14 around which a new tape 10 is wound. Last, as shown in FIG. 11, the operator connects a terminal end portion 37 of the prior tape 10 currently supplying the SO packages 12, and an initial end portion 38 of the new tape 10 subsequently supplying the SO packages 12, to each other, using a tape connecting member 40.

Figure 4:
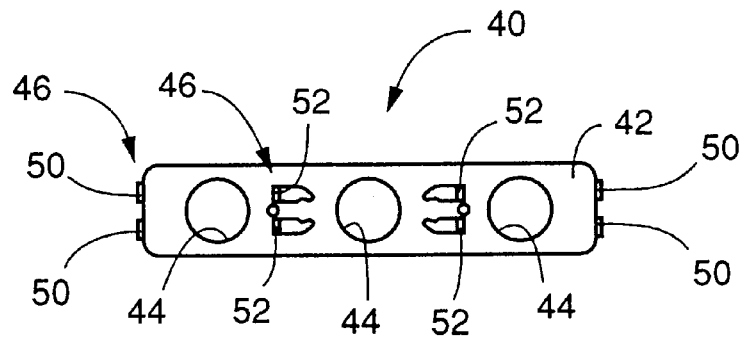
FIG. 4 is a plan view of a tape connecting member as an embodiment of the present invention.
Figure 5:
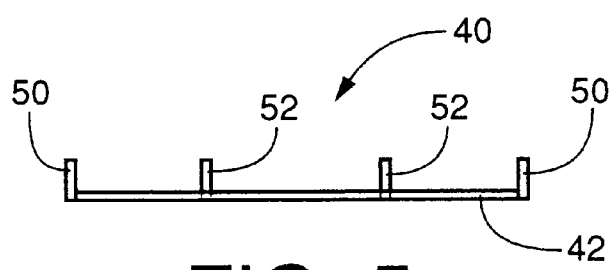
FIG. 5 is a front elevation view of the tape connecting member of FIG. 4.

As shown in FIGS. 4 and 5, the tape connecting member 40 includes a flat main portion 42 which is formed of a generally rectangular metal plate; a plurality of tape-feed holes 44 (three tape-feed holes 44, in the present embodiment) which are formed through a thickness of the flat main portion 42 at the same regular pitch as that of the EC carrier tapes 10 in a lengthwise direction of the main portion 42; and a plurality of caulking projections 46 (eight caulking projections 46, in the present embodiment) which project from the flat main portion 42 in a direction perpendicular thereto. The main portion 42 has a width which is not greater than twice a distance between the center of each of the tape-feed holes 32 of each EC carrier tape 10 and a side edge of the widthwise end portion 31 of the carrier tape 10. Each of the caulking projections 46 has a height greater than the thickness of each EC carrier tape 10. In the present embodiment, the eight caulking projections 46 include two sorts of projections, i.e., four Y-shaped projections 50 two of which project from one of lengthwise opposite end portions of the main portion 42 and the other two of which project from the other lengthwise end portion of the main portion 42; and four inverted-J-shaped projections 52 two of which project from a first intermediate portion of the main portion 42 between one pair of adjacent tape-feed holes 44 of the three tape-feed holes 44 and the other two of which project from a second intermediate portion of the main portion 42 between the other pair of adjacent tape-feed holes 44 of the three tape-feed holes 44. Thus, the two pairs of Y-shaped projections 50 are provided at two locations, respectively, which are apart from each other in the lengthwise direction of the main portion 42, and similarly the two pairs of inverted-J-shaped projections 52 are provided at two locations, respectively, which are apart from each other in the lengthwise direction of the main portion 42. A distance between the center of each of opposite end tape-feed holes 44 of the three tape-feed holes 44 and a corresponding pair of Y-shaped projections 50 is equal to that between that center and a corresponding pair of inverted-J-shaped projections 52.

Figure 6:
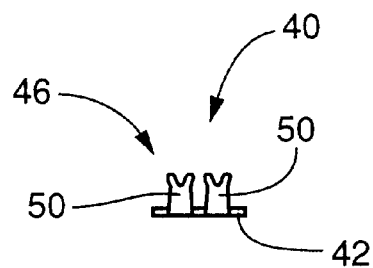
FIG. 6 is a side elevation view of the tape connecting member of FIG. 4.
Figure 7:
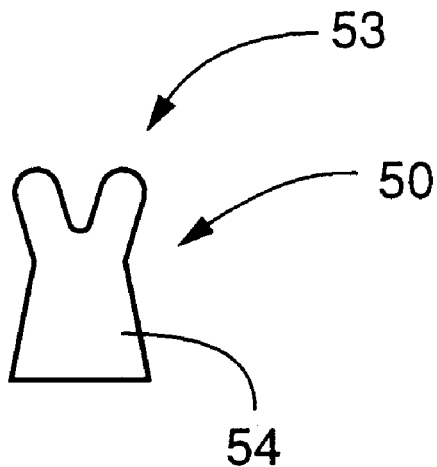
FIG. 7 is an enlarged view of a caulking tape connecting member of FIG. 4.
Figure 8:
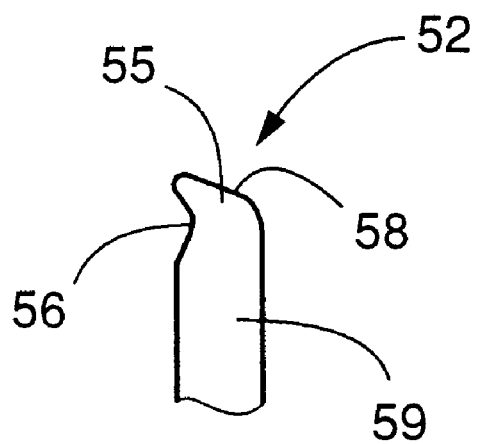
FIG. 8 is an enlarged view of another caulking tape connecting member of FIG. 4.

The two pairs of Y-shaped projections 50 are formed by bending two pairs of projecting portions which respectively project from the lengthwise opposite ends of the flat main portion 42 in opposite directions parallel to the plane of the main portion 42, such that the bent projecting portions extend in the same direction perpendicular to the plane of the main portion 42, as shown in FIG. 5. Each pair of Y-shaped projections 50 are arranged in the widthwise direction of the main portion 42, as shown in FIG. 6. Each Y-shaped projection 50 includes a bifurcated upper portion 53 which gives a generally Y-shape configuration thereto. As shown in the enlarged view of FIG. 7, each Y-shaped projection 50 includes a base portion 54 having a trapezoidal shape. The width of the base portion 54 decreases in a direction toward the upper portion 53, which is formed in a range corresponding to the maximum width of the base portion 54. Each inverted-J-shaped projection 52 is formed by cutting, and then bending, a portion of the main portion 42 such that the bent portion extends perpendicularly to a remaining portion of the main portion 42, as shown in FIG. 5. Therefore, the main portion 42 has four openings each having a shape corresponding to each inverted-J-shaped projection 52, as shown in FIG. 4. As shown in the enlarged view of FIG. 8, each inverted-J-shaped projection 52 has a generally inverted-J-shaped configuration wherein an upper portion 55 of the projection 52 is curved in a direction having a component parallel to a widthwise direction of the projection 52. The inverted-J-shaped curved portion 55 is formed by forming a recess 56 in an inner one of widthwise opposite end portions of the projection 52 and forming an upper end edge 58 which is inclined such that one of opposite ends of the upper end edge 58 on the side of the inner end portion is more distant from the main portion 42 than the other end of the same 58 on the side of the other, outer end portion. The recess 56 is defined by a generally concave curve. Thus, the curved portion 55 is formed in a range corresponding to a width of a base portion 59 of the projection 52. Like each pair of Y-shaped projections 50, each pair of inverted-J-shaped projections 52 are formed side by side in the widthwise direction of the main portion 42, and the two projections 52 are symmetrical with each other such that the respective curved portions 55 thereof extend inward toward each other.

Next, there will be described a tape connecting tool 60 for connecting the terminal end portion 37 of the prior EC carrier tape 10 and the initial end portion 38 of the new EC carrier tape 10 using the above-described tape connecting member 40.

Figure 9:
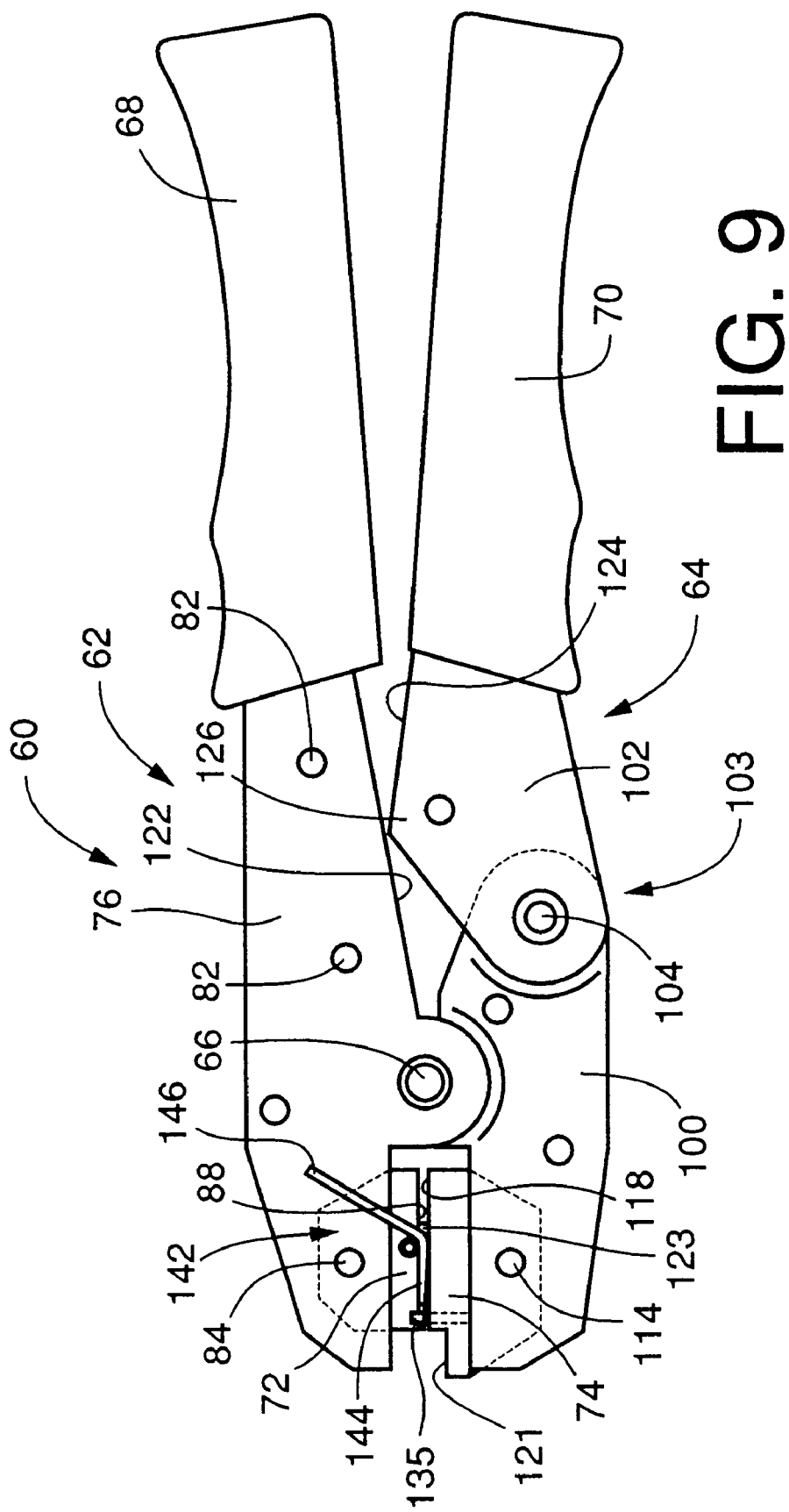
FIG. 9 is a side elevation view of a tape connecting tool as an embodiment of the present invention.
Figure 10:
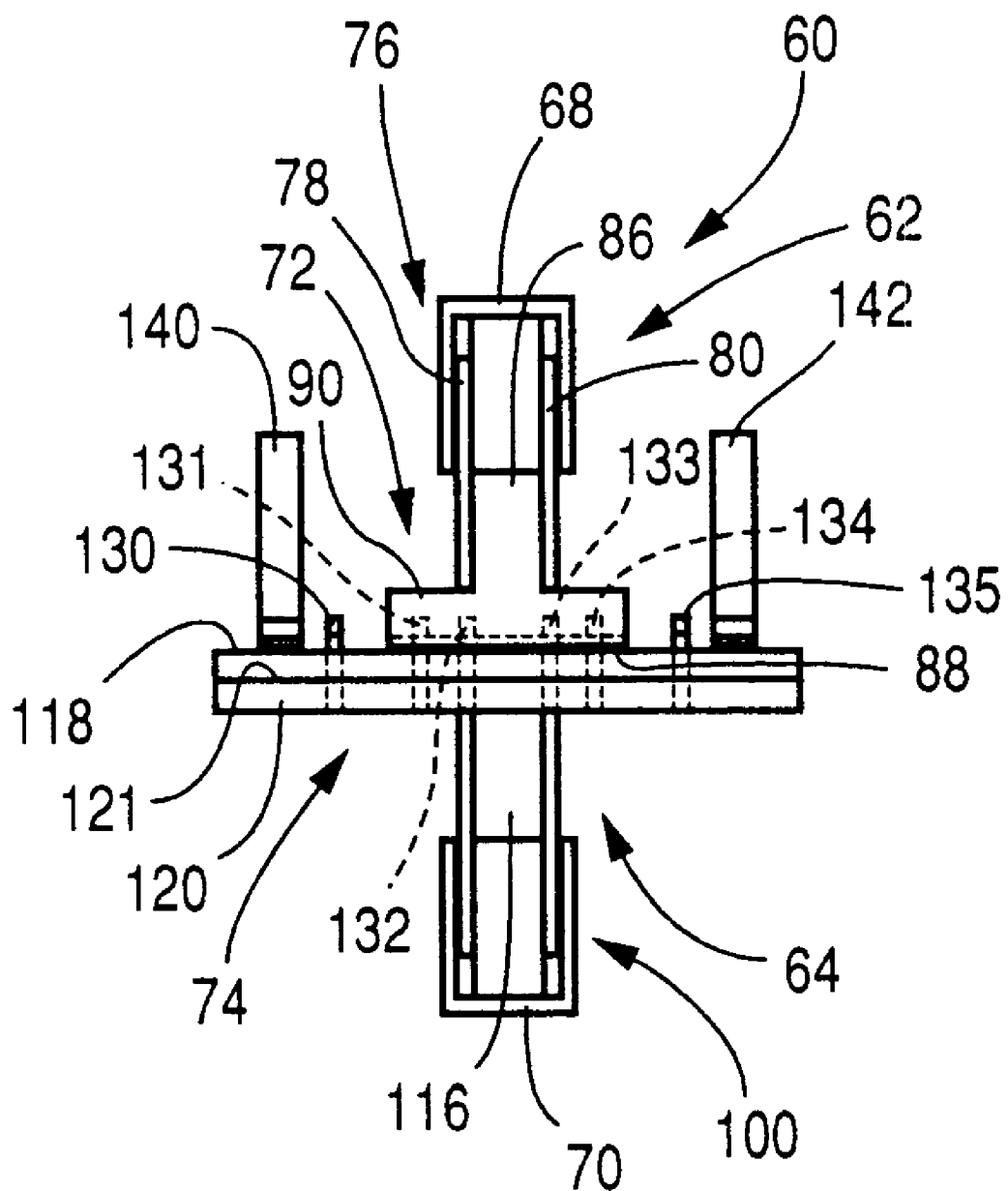
FIG. 10 is a front elevation view of the tape connecting tool of FIG. 9.

As shown in FIGS. 9 and 10, the tape connecting tool 60 includes a first and a second lever 62, 64 each of which has an elongate shape. The first and second levers 62, 64 are joined to each other via an axis member 66, such that the two levers 62, 64 are pivotable relative to each other. The axis member 66 is located near respective front end portions of the two levers 62, 64 (i.e., left-hand end portions as seen in FIG. 9), and extends in a widthwise direction perpendicular to a lengthwise direction of the tool 60. Two handle members 68, 70 are fixed to respective rear end portions of the two levers 62, 64 (i.e., right-hand end portions as seen in FIG. 9), to provide a pair of handles. In addition, two pressing plates 72, 74 are fixed to the respective front end portions of the two levers 62, 64.

The first lever 62 includes a main member 76 which includes two side plates 78, 80 each extending in a lengthwise direction of the lever 62. The two side plates 78, 80 are connected to each other by a plurality of connecting pins 82 extending in the widthwise direction of the tool 60, such that the two side plates 78, 80 are not movable relative to each other. The first handle member 68 is formed of a synthetic resin to have an inverted-U-shaped cross section, and is fitted on, and fixed to, the main member 76 such that a lower opening of the inverted-U-shaped handle member 68 is located on the side of the second lever 64. The first pressing plate 72 is connected to the front end portion of the main member 76 via an axis member 84 which extends in the widthwise direction of the tool 60. The first pressing plate 72 has an inverted-T-shaped cross section, and includes a connection portion 86 which is fitted in the main member 76 and is connected to the main member 76 via the axis member 84, and a main portion 90 which has a pressing surface 88 whose width is greater than that of the connection portion 86. The axis member 84 connects the pressing plate 72 to the first lever 62 such that the pressing plate 72 is pivotable relative to the main member 76. Since, however, the main portion 90 having the width greater than that of the connection portion 86 is held in contact with the main member 76, it is substantially impossible that the pressing plate 72 be pivotable relative to the first lever 62.

The second lever 64 includes a first and a second member 100, 102. A rear end portion of the first member 100 and a front end portion of the second member 102, that is, respective connection portions 103 of the two members 100, 102 are connected to each other via an axis member 104 such that the two members 100, 102 are pivotable relative to each other. The connection portions 103 are slightly spaced rearward from the axis member 66 in the lengthwise direction of the tool 60, and the axis member 103 extends parallel to the axis member 66. The first and second members 100, 102 have generally the same width, but the width of the rear end portion of the first member 100 is smaller than that of the second member 102. The rear end portion of the first member 100 is fitted in the front end portion of the second member 102, and the axis member 104 connects the rear and front end portions of the first and second members 100, 102, i.e., the respective connection portions 103 of the two members 100, 102, to each other. In addition, the two members 100, 102 have generally the same width as that of the main member 76 of the first lever 62, but the width of an intermediate portion of the first member 100 on the side of the first lever 62 is smaller than that of the main member 76. Thus, the intermediate portion of the first member 100 is fitted in the main member 76, and the axis member 66 connects the first member 100 to the first lever 62.

Like the main member 76 of the first lever 62, each of the first and second members 100, 102 includes two side plates which extend in the lengthwise direction of the tool 60, and a plurality of connecting pins which cooperate with each other to connect the two side plates to each other such that the two side plates are not movable relative to each other. The second handle member 70 similar to the first handle member 68 is fitted on, and fixed to, a rear end portion of the second member 102.

The second pressing plate 74 is connected to a front end portion of the first member 100 via an axis member 114. Symmetrically with the first pressing plate 74, the second pressing plate 74 has a generally T-shaped cross section, and includes a connection portion 116 which is fitted in the first member 100, and a main portion 120 which has a pressing surface 118 whose width is greater than that of the connection portion 116. Like the first pressing plate 72, it is substantially impossible that the second pressing plate 74 be pivoted relative to the first member 100. The two pressing plates 72, 74 are held by the two levers 62, 64, respectively, such that the respective pressing surfaces 88, 118 of the two plates 72, 74 are opposed to each other and such that a front end portion and widthwise opposite end portions of the second pressing plate 74 extend over the first pressing plate 72. The front end portion of the second pressing plate 74 which extends over the first pressing plate 72 has a stepped surface 121 which is stepped from the second pressing surface 118 and extends in the widthwise direction of the tool 60. A plurality of stoppers 123 are provided along a line of intersection of the second pressing surface 118 and a plane containing respective axis lines of the two axis members 84, 114. The stoppers 123 cooperate with each other to define a minimum distance between the two pressing surfaces 88, 118 when the two surfaces 88, 118 are moved toward each other.

The second member 102 includes a projecting portion 126 which projects, near the connection portions 103, toward the main member 76 of the first lever 62, from an inner end surface 124 (i.e., upper end surface as seen in FIG. 9) of the second member 102 which is opposed to an inner end surface 122 (i.e. lower end surface as seen in FIG. 9) of the main member 76. The axis member 66 is provided with a torsion coil spring (not shown) having two arms one of which is engaged with one of the connecting pins 82 of the first lever 62 and the other of which is engaged with one of the connecting pins of the first member 100 of the second lever 64. Thus, the first lever 62 and the first member 100 of the second lever 64 are biased by the coil spring in a direction in which the two pressing surfaces 88, 118 are moved away from each other. Therefore, in an inoperative state of the tool 60 in which the operator does not apply any force to the handle members 68, 70, the end surface 122 of the main member 76 of the first lever 62 is held in contact with the projecting portion 126 of the second member 102 of the second lever 64 and the two handle members 68, 70 are stably kept apart from each other. When the operator's hand grasps the two handle members 68, 70 and applies a sufficiently great force against the biasing force of the torsion coil spring to move the two handle members 68, 70 toward each other, the respective engaged portions of the projecting portion 126 and the end surface 122 cooperate with each other to define a fulcrum for the front end portion of the second member 102 to be pivoted in a direction away from the first lever 62. Consequently the first member 100 is pivoted about the axis member 104, so that the front end portion of the first member 100 is moved toward the first lever 62. Since the front end portion of the first member 100 is moved toward the first lever 62, the pressing surface 88 of the first pressing plate 72 and the pressing surface 118 of the second pressing plate 74 are moved toward each other.

A plurality of positioning projections 130, 131, 132, 133, 134, 135 (i.e., six projections, in the present embodiment) project from the pressing surface 118 of the second pressing plate 74, such that the projections 130–135 are arranged in an array in the widthwise direction of the tool 60. Each of the projections 130–135 has a diameter slightly smaller than that of each tape-feed hole 32, 44 of each EC carrier tape 10 or the tape connecting member 40. The projections 130–135 project toward the pressing surface 88 of the first pressing plate 72. The two end projections 130, 135 are provided at two locations, respectively, which are apart from widthwise opposite ends of the first pressing plate 72, respectively. In the present embodiment, the distance between the two projections 131, 132 or the distance between the two projections 133, 134 is equal to the regular pitch of the tape-feed holes 32, 34. However, the distance between the two projections 132, 133 is equal to twice the regular pitch. Likewise, the distance between the two projections 130, 131 or the distance between the two projections 134, 135 is equal to twice the regular pitch. That is, it is possible to determine the distance between each pair of adjacent projections of the six projections 130–135, at an appropriate multiple of the regular pitch.

Figure 14:
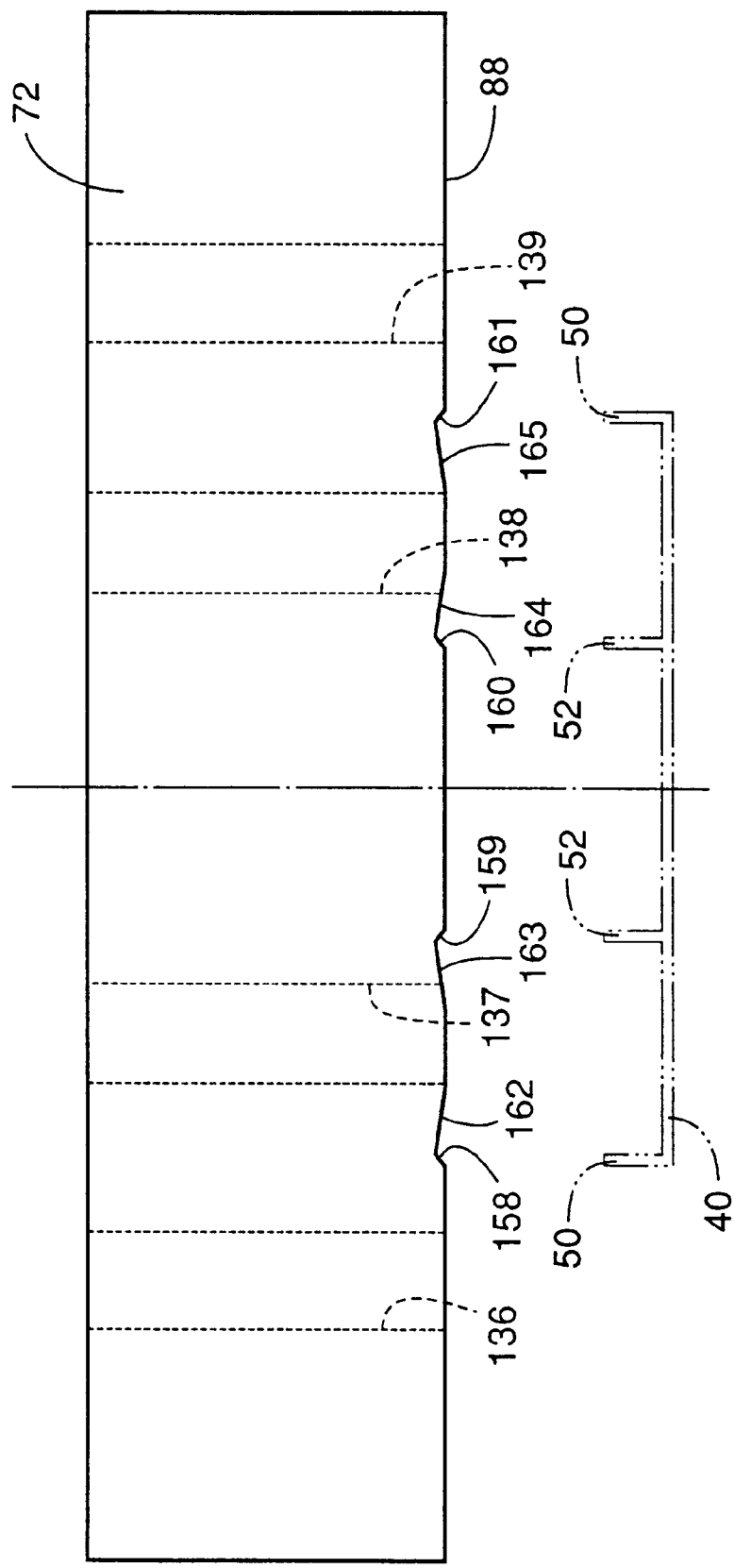
FIG. 14 is a front elevation view of a pressing plate of the tape connecting tool of FIG. 9.

As shown in the enlarged view of FIG. 14, the pressing surface 88 of the first pressing plate 72 has, at respective positions corresponding to the four positioning projections 131–134, four recesses 136, 137, 138, 139 (i.e., through-holes 136–139, in the present embodiment) for receiving the four projections 131–134, respectively. On both sides of the hole 137, there are formed two guide surfaces 158, 159, respectively; and on both sides of the hole 138, there are formed two guide surfaces 160, 161, respectively. The two guide surfaces 158, 161 define opposite directions, respectively, in which the corresponding two pairs of Y-shaped projections 50 are buckled; and the two guide surfaces 159, 160 define opposite directions, respectively, in which the corresponding two pairs of inverted-J-shaped projections 52 are buckled. One pair of guide surfaces 158, 159 are inclined such that the distance between the two surfaces 158, 159 decreases in a direction away from the pressing surface 88. Therefore, the corresponding one pair of Y-shaped projections 50 and the corresponding one pair of inverted-J-shaped projections 52 are buckled in opposite directions, respectively, so that the distance between the free end portions (i.e., upper portions 52) of the projections 50 and the free end portions (i.e., curved portions 55) of the projections 52 decreases. The two guide surfaces 158, 159 cooperate with two more gentle inclined surfaces 162, 163, respectively, to define two V-shaped grooves, respectively. The bottom of each V-shaped groove is so rounded to provide a smooth transition from the guide surface 158 or 159 to the corresponding inclined surface 162 or 163. These are true with the two guide surfaces 160, 161 which cooperate with two more gentle inclined surfaces 164, 165 to define two V-shaped grooves, respectively.

Figure 12:
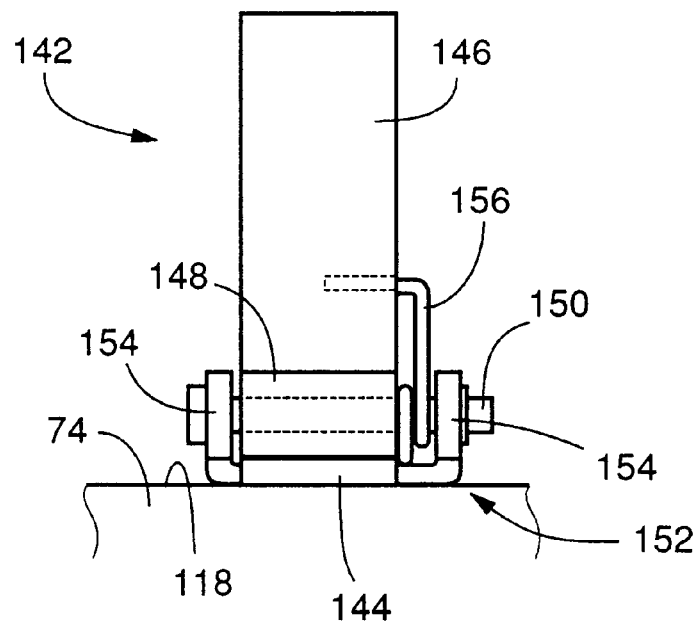
FIG. 12 is a front elevation view of a tape hold-down member of the tape connecting tool of FIG. 9.
Figure 13:
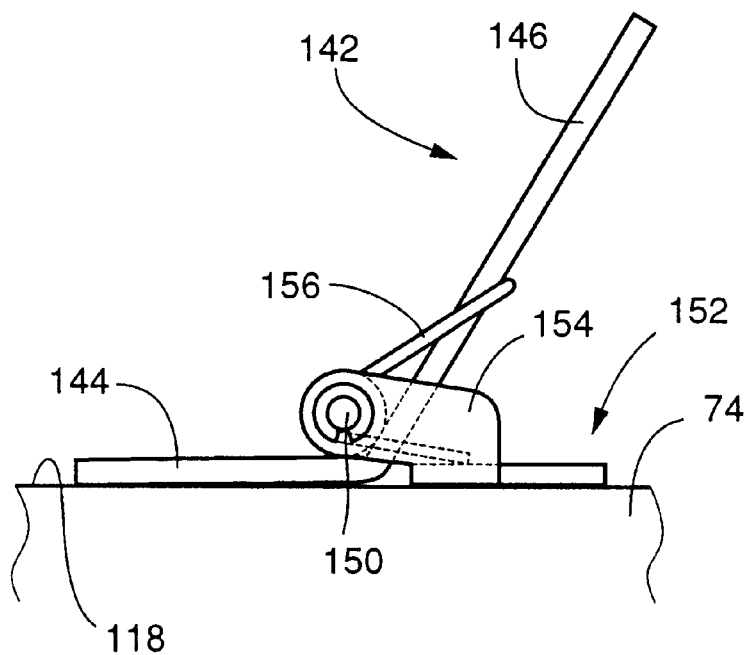
FIG. 13 is a side elevation view of the tape hold-down member of FIG. 12.

Two tape hold-down members 140, 142 are attached to two locations on the pressing surface 118 which are outside the two end positioning projections 130, 135, respectively. As shown in FIGS. 12 and 13, each of the tape hold-down members 140, 142 includes a hold-down portion 144 and an operative portion 146 which are formed by curving a belt-like metal plate at an intermediate portion thereof. Each hold-down member 140, 142 additionally includes a cylindrical boss member 148 which is fixed to the curved intermediate portion between the two portions 144, 146. Each of the two boss members 148 is attached to the pressing plate 74 via an axis member 150 and a bracket 152. Each of the two brackets 152 includes a pair of side portions 154 which support axially opposite end portions of the corresponding axis member 150 whose axially intermediate portion passes through the corresponding boss member 148. Each bracket 152 is fixed, by an appropriate means or method such as spot welding, to the pressing plate 74. Thus, the two tape hold-down members 140, 142 are attached to the pressing plate 74 such that each hold-down member 140, 142 is pivotable relative to the pressing plate 74. Each of the two axis members 150 is provided with a torsion coil spring 156 as a sort of biasing member, and is biased by the coil spring 156 in a direction in which the hold-down portion 144 of the corresponding tape hold-down member 140, 142 is elastically pressed against the pressing surface 118 of the pressing plate 74. When the operator depresses the operative portion 146 of each tape hold-down member 140, 142, the corresponding hold-down portion 144 is moved away from the pressing surface 118 against the biasing force of the torsion coil spring 156.

Next, there will be described the manner in which two EC carrier tapes 10 are connected to each other using the tape connecting tool 60 constructed as described above.

While the tape connecting tool 60 is not used, the tool 60 is held in the above-described stable state in which the respective pressing plates 72, 74, and respective handle members 68, 70, of the first and second leers 62, 64 are apart from each other. In this state, the two positioning projections 132, 133 of the pressing surface 118 are passed through the two end tape-feed holes 44 of the three tape-feed holes 44 of the tape connecting member 40, so that the connecting member 40 is positioned relative to the pressing surface 118. The two pairs of Y-shaped projections 50 respectively provided on the lengthwise opposite ends of the tape connecting member 40 correspond to a first intermediate position between one pair of adjacent projections 131, 132 and a second intermediate position between another pair of adjacent projections 133, 134, respectively. Subsequently, the operator depresses the operative portion 146 of the first tape hold-down member 140, thereby moving the corresponding hold-down portion 144 away from the pressing surface 118. In this state, the three positioning projections 130, 131, 132 are passed through the three tape-feed holes 32, respectively, of the terminal end portion 37 of the EC carrier tape 10 which currently supplies the SO packages 12. Then, the operator releases the operative portion 146, thereby causing the corresponding hold-down portion 144 to hold down the terminal end portion 37. Similarly, the operator depresses the operative portion 146 of the second tape hold-down member 142, thereby moving the corresponding hold-down portion 144 away from the pressing surface 118. In this state, the three positioning projections 133, 134, 135 are passed through the three tape-feed holes 32, respectively, of the initial end portion 38 of the EC carrier tape 10 which next supplies the SO packages 12. Then, the operator releases the operative portion 146, thereby causing the corresponding hold-down portion 144 to hold down the initial end portion 38. Thus, the tape connecting member 40 and the two EC carrier tapes 10 are positioned on the pressing surface 118. In this state, shown in FIG. 11, one end tape-feed hole 44 of the connecting member 40 is aligned with one tape-feed hole 32 of the terminal end potion 37 of the current EC carrier tape 10, the other end tape-feed hole 44 of the connecting member 40 is aligned with one tape-feed hole 32 of the initial end potion 38 of the next EC carrier tape 10, and the central tape-feed hole 44 of the connecting member 40 is aligned with respective half or semi-circular tape-feed holes 32 of the two end portions 37, 38. In addition, one pair of inverted-J-shaped projections 52 are positioned at a position between the half tape-feed hole 32 and its adjacent full tape-feed hole 32 of the terminal end portion 37, and the other pair of inverted-J-shaped projections 52 are positioned at a position between the half tape-feed hole 32 and its adjacent full tape-feed hole 32 of the initial end portion 38. And, one pair of Y-shaped projections 50 are positioned at a position between a pair of adjacent full tape-feed holes 32 of the terminal end portion 37, and the other pair of Y-shaped projections 50 are positioned at a position between a pair of adjacent full tape-feed holes 32 of the initial end portion 38. Thus, the setting of the two carrier tapes 10 on the tool 60 is finished.

Next, when the operator grasps the two handle members 68, 70, thereby moving the two handle members 68, 70 toward each other, the first and second members 100, 102 of the second lever 64 are pivoted relative to each other so that the second lever 64 is extended into a substantially straight state. Thus, the second pressing plate 74 is moved toward the first pressing plate 72. As the two pressing plates 72, 74 are moved toward each other, the pressing surface 88 presses the respective upper surfaces 29 of the two EC carrier tapes 10, and the pressing surface 118 presses the tape connecting member 40, so that the respective upper portions 53 of the four Y-shaped projections 50 and the curved portions 55 of the four inverted-J-shaped projections 52 penetrate through the thickness of the carrier tapes 10 and project out of the upper surfaces 29 of the carrier tapes 10. Thus, the two pairs of upper portions 53 and the two pairs of curved portions 55 engage the four guide surfaces 158–161, respectively. When the two pressing plates 72, 74 are further moved toward each other from this state, the two pairs of upper portions 53 and the two pairs of curved portions 55 are buckled by being guided by the four guide surfaces 158–161, such that the distance between one pair of upper portions 53 and the corresponding pair of curved portions 55 decreases and likewise the distance between the other pair of upper portions 53 and the corresponding, other pair of curved portions 55 decreases. And, when the two pressing plates 72, 74 are further moved toward each other, the two pairs of upper portions 53 and the two pairs of curved portions 55 are bent by the four inclined surfaces 162–166, respectively, and are completely flattened. The transition of the upper portions 53 and the curved portions 55 from the guide surfaces 158–161 to the inclined surfaces 162–165 are smoothly performed by the rounded bottoms of the V-shaped grooves between the surfaces 158–161 and the corresponding surfaces 162–165. When each Y-shaped projection 50 is flattened, the bifurcated upper portion 53 thereof is flattened by the corresponding guide surface 158, 161 and the corresponding inclined surface 162, 165, such that the two arms of the Y shape are opened outward; and when each inverted-J-shaped projection 52 is flattened, the curved upper portion 55 thereof is flattened by the corresponding guide surface 159, 160 and the corresponding inclined surface 163, 164, in a direction having a component parallel to the widthwise direction of the projection 52. In a state in which the flat main portion 42 of the tape connecting member 40 is held in close contact with the respective back surfaces 30 of the two carrier tapes 10, respective portions of the Y-shaped and inverted-J-shaped projections 50, 52 that penetrate out of the upper surfaces 29 of the two carrier tapes 10 have completely been flattened. Thus, the tape connecting member 40 is prevented from coming off the carrier tapes 10, and the two carrier tapes 10 are securely connected to each other. In this state, respective free end portions of the four positioning projections 131–134 provided on the pressing surface 118 project from the respective upper surfaces 29 of the two carrier tapes 10. However, the four projections 131–134 are safely received by the four holes 136–139 formed in the pressing surface 88 of the first pressing plate 72, respectively. Thus, the two pressing plates 72, 74 are safely moved toward each other. In addition, since the movement of the two plates 72, 74 toward each other is stopped by the stoppers 123, the carrier tapes 10 and the caulking projections 50, 52 are effectively prevented from being excessively flattened, i.e., being broken.

After the two EC carrier tapes 10 are connected to each other in this way, the operator releases the two handle members 68, 70 of the tool 60. In response thereto, the front end portion of the first member 100 is moved apart from the first lever 62 by the biasing action of the torsion coil spring (not shown), so that the respective pressing surfaces 88, 118 of the two pressing plates 72, 74 are returned to their initial state in which the two pressing surfaces 88, 118 are kept apart from each other. In this state, the operator moves the respective hold-down portions 144 of the two tape hold-down members 140, 142, apart from the pressing surface 118, and removes the connected end portions 37, 38 of the two carrier tapes 10 from the tape connecting tool 60.

In the present embodiment, each EC carrier tape 10 has a constant thickness over its entire length including the terminal or initial end portion 37, 38. Therefore, only the upper portions 53 and the curved portions 55 of the Y-shaped and inverted-J-shaped projections 50, 52 project from the upper surface 29 of the carrier tape 10, and only those portions 53, 55 are caulked. Since the length of each of the respective portions of the Y-shaped and inverted-J-shaped projections 50, 52 that project from the upper surface 29 of the carrier tape 10 is short, the each projecting portion can not easily be buckled. Since, however, the respective widths of the portions 53, 55 of the projections 50, 52 are smaller than those of the remaining portions of the same 50, 52 and simultaneously are curved in a direction having a component parallel to the widthwise direction thereof, the portions 53, 55 are easily flattened in the direction having the component parallel to the widthwise direction. Thus, the tape connecting member 40 is effective prevented from coming off the carrier tapes 10. Thus, the terminal end portion 37 of the current tape 10 and the initial end portion 38 of the next tape 10 are securely connected to each other.

On the other hand, in the case where two embossed-type EC carrier tapes are connected to each other using the tape connecting member 40 and the tape connecting tool 60, respective end portions of those carrier tapes which are to be connected to each other are much thinner than those of the card-based EC carrier tapes 10. Therefore, not only the upper and curved portions 53, 55 of the Y-shaped and inverted-J-shaped projections 50, 52 but also respective considerable proportions of the base portions 54, 59 of the same 50, 52 penetrate through the thickness of the end portions of the embossed-type tapes and project from the same, and those long projecting portions can be caulked. However, the minimum distance between the two pressing surfaces 88, 118 is defined by the height of the stoppers 123. Therefore, the Y-shaped and inverted-J-shaped projections 50, 52 are not caulked to such an extent that the long projecting portions thereof entirely contact the upper surfaces of the carrier tapes. That is, respective intermediate portions of the projections 50, 52 are kept apart from the upper surfaces of the carrier tapes. However, the upper and curved portions 53, 55 are kept in close contact with the upper surfaces of the carrier tapes, and cooperate with the main portion 42 to sandwich the to-be-connected end portions of the two carrier tapes. That is, the terminal and initial end portions of the two embossed-type carrier tapes are securely connected to each other. If two embossed-type carrier tapes are connected to each other using a tape connecting tool without any stoppers 123, the Y-shaped and inverted-J-shaped projections 50, 52 are completely caulked, those embossed-type tapes would be excessively flattened and be widened laterally outward. This problem is effectively avoided by the stoppers 123. In the case where the tape connecting member 40 and the tape connecting tool 60 are used for connecting two embossed-type EC carrier tapes to each other, the stepped portion 121 formed in the second pressing plate 74 receives the respective embossed portions of the carrier tapes. Thus, the two embossed-type tapes are securely connected to each other while the embossed portions thereof are effectively prevented from being damaged.

As is apparent from the foregoing description of the preferred embodiment, the axis member 104 provides a first axis member; and the axis member 66 provides a second axis member. The projecting portion 126 of the second member 102 of the second lever 64 and the portion of the main member 76 of the first lever 62 that corresponds to the projecting portion 126 cooperate with each other to define a pair of fulcrum-defining portions; and the first and second levers 62, 64, the axis members 66, 104, and the fulcrum-defining portions cooperate with one another to provide a pressing mechanism.

Thus, the tape connecting member 40 and the tape connecting tool 60 are applicable to not only the card-based EC carrier tapes 10 or the embossed-type EC carrier tapes but also other sorts of EC carrier tapes having various thickness values.

In the illustrated embodiment, each pair of Y-shaped projections 50 and a corresponding pair of inverted-J-shaped projections 52 are caulked such that the distance between the respective bifurcated portions 53 of the projections 50 and the respective curved portions 55 of the projections 52 decreases and such that the two caulked bifurcated portions 53 or the two caulked curved portions 55 extend substantially symmetrically with each other with respect to a straight line parallel to the lengthwise direction of the main portion 42. Therefore, when the caulking projections 46 are caulked, substantially no error occurs to the relative position between the tape connecting member 40 and each EC carrier tape 10. In addition, the connecting member 40 is connected to each carrier tape 10 so strongly that the projections 50, 52 are prevented from coming off the carrier tape 10. Meanwhile, the width of the bifurcated portion 53 of each Y-shaped projection 50 or the width of the curved portion 55 of each inverted-J-shaped projection 52 is smaller than that of the base portion of the each projection 50 or that of the base portion of the each projection 52, respectively. Therefore, when the bifurcated or curved portion 53 or 55 penetrates each carrier tape 10, no excessively large hole is formed in the tape 10. If, otherwise, the bifurcated or curved portion 53 or 55 would project laterally from the base portion of the corresponding projection 50 or 52, the base portion would be loose in an excessively large hole which is formed in the tape 10 as a result of the penetration of the laterally projecting portion 53 or 55, and would be allowed to move relative to the tape 10. Thus, the accuracy of positioning of the connecting member 40 relative to the tape 10 would be lowered. This leads to lowering the accuracy of positioning of the two tapes 10 relative to each other. In contrast, the above illustrated tape connecting method, member 40, and tool 60 enjoy a satisfactory tape-positioning accuracy. In addition, since the width of the bifurcated or curved portion 53 or 55 is smaller than that of the base portion of the corresponding projection 50 or 52, the portion 53 or 55 is easily be caulked and accordingly is well prevented from being buckled at the base portion. Thus, the connecting member 40 can advantageously connect the two tapes 10 to each other.

Moreover, the second member 102 of the second lever 64 is constructed such that the distance between the projecting portion 126 functioning as one of the fulcrum-defining portions, and the axis member 104 is larger than that between the projecting portion 126 and the middle portion of the handle member 70. Therefore, the operator can caulk, with a considerably small force, the caulking projections 46 of the tape connecting member 40. However, the first or second lever 62 or 64 is not limited to its illustrated construction but may be embodied in other manners. For example, the tape connecting tool 60 may include a first and a second lever which cross each other like a pair of scissors and which are coupled to each other such that the two levers are pivotable relative to each other about an axis member extending through the respective crossing portions thereof.

In the illustrated embodiment, the two pairs of Y-shaped projections 50 are provided at the lengthwise opposite end portions of the tape connecting member 40 (i.e., the flat main portion 42 thereof), respectively, and the two pairs of inverted-J-shaped projections 52 are provided between the opposite end portions of the connecting member 40, such that the two pairs of projections 52 are apart from each other in the lengthwise direction of the member 40. However, the positions where the projections 46 (50, 52) are provided may be changed, as needed, and the shapes of the same 46 may be changed, as needed.

In the illustrated embodiment, the tape connecting member 40 connects the two EC carrier tapes 10 to each other such that in the state in which the flat main portion 42 thereof closely contacts the respective back surfaces 30 of the two tapes 10, the caulking projections 46 projecting from the upper surfaces 29 of the same 10 are caulked. However, it is possible that the connecting member 40 connect the two tapes 10 such that in the state in which the main portion 42 closely contacts the respective upper surfaces 29 of the two tapes 10, the caulking projections 46 projecting from the back surfaces 30 of the same 10 are caulked.

In the illustrated embodiment, the tape connecting tool 60 requires the operator to manually set one tape connecting member 40 each time the tool 60 connects two EC carrier tapes 10 to each other. However, it is possible to modify the tool 60 such that the operator successively connect, with a plurality of tape connecting members 40, a plurality of pairs of EC carrier tapes 10, respectively. For example, like in a stapler, a plurality of tape connecting members 40 which are adhered to each other in the widthwise direction thereof are set in the modified tool 60 such that each of the members 40 can be separated from the other members 40 and be fed to the tape-connecting position where the each member 40 connects two tapes 10 to each other. In the last case, it is preferred that at least one pair of the two pairs of projections 50 which are provided at the lengthwise opposite end portions of each member 40, respectively, project from the widthwise opposite end portions, respectively, of the corresponding lengthwise opposite end portion of the each member 40. The at least one pair of projections 50 also function as guided portions which are guided when the each member 40 is fed in the modified tool 60.

It is to be understood that the present invention may be embodied with other changes, improvements, and modifications that may occur to the person skilled in the art without departing from the scope and spirit of the invention defined in the appended claims.

What is claimed is:

1. A method of connecting respective one end portions of a first carrier tape and a second carrier tape, to each other, each of the first and second carrier tapes having a plurality of component accommodating pockets at a first pitch along a first straight line, and having a plurality of tape-feed holes at a second pitch along a second straight line parallel to the first straight line, each of the component accommodating pockets accommodating an electric component therein, the method comprising the steps of:

aligning a tape connecting member which includes (a) a flat main portion having a plurality of tape-feed holes at a third pitch equal to the second pitch, and (b) a plurality of caulking projections projecting from the flat main portion in a direction perpendicular thereto, with the respective one end portions of the first and second carrier tapes, such that at least one first hole of the tape-feed holes of the tape connecting member is aligned with at least one of the tape-feed holes of the first carrier tape and at least one second hole of the tape-feed holes of the tape connecting member is aligned with at least one of the tape-feed holes of the second carrier tape, causing at least one first projection of the caulking projections of the tape connecting member to penetrate through a thickness of the first carrier tape, and at least one second projection of the caulking projections to penetrate through a thickness of the second carrier tape, so that the flat main portion of the tape connecting member contacts one of opposite surfaces of the first carrier tape and one of opposite surfaces of the second carrier tape, and caulking respective portions of the first and second projections that penetrate out of the respective other surfaces of the first and second carrier tapes, so that the respective one end portions of the first and second carrier tapes are connected to each other.

2. A method according to claim 1, wherein the tape-feed holes of said each of the first and second carrier tapes are formed in one of widthwise opposite end portions of said each carrier tape, and wherein a width of the tape connecting member is not greater than double a distance between a center of each of the tape-feed holes and one of widthwise opposite end edges of said each carrier tape that is nearer to the center of said each tape-feed hole than the other end edge.

3. A method according to claim 1, further comprising forming the caulking projections by bending a plurality of portions of a metal plate such that the bent portions are perpendicular to a remaining portion of the metal plate.

4. A method according to claim 1, wherein the step of causing said at least one first projection of the caulking projections to penetrate through the thickness of the first carrier tape, and said at least one second projection of the caulking projections to penetrate through the thickness of the second carrier tape, comprises causing a plurality of first caulking projections arranged in a widthwise direction of the flat main portion, to penetrate through the thickness of the first carrier tape, and simultaneously causing a plurality of second caulking projections arranged in the widthwise direction of the flat main portion and apart from the first caulking projections in a lengthwise direction of the flat main portion, to penetrate through the thickness of the second carrier tape.

5. A method according to claim 1, wherein the step of causing said at least one first projection of the caulking projections to penetrate through the thickness of the first carrier tape, and said at least one second projection of the caulking projections to penetrate through the thickness of the second carrier tape, comprises causing at least one first Y-shaped caulking projection including a bifurcated free end portion including two arm portions, to penetrate through the thickness of the first carrier tape, and causing at least one second Y-shaped caulking projection including a bifurcated free end portion including two arm portions, to penetrate through the thickness of the second carrier tape.

6. A method according to claim 5, wherein the step of caulking said respective portions of the first and second projections comprises caulking the respective bifurcated free end portions of said first and second Y-shaped caulking projections that penetrate out of the respective other surfaces of the first and second carrier tapes, such that the two arm portions of each of the first and second Y-shaped caulking projections is opened outward.

7. A method according to claim 1, wherein the step of causing said at least one first projection of the caulking projections to penetrate through the thickness of the first carrier tape, and said at least one second projection of the caulking projections to penetrate through the thickness of the second carrier tape, comprises causing at least one first inverted-J-shaped caulking projection including a curved free end portion curved in a direction having a component parallel to a widthwise direction of the flat main portion, to penetrate through the thickness of the first carrier tape, and causing at least one second inverted-J-shaped caulking projection including a curved free end portion curved in a direction having a component parallel to the widthwise direction of the flat main portion, to penetrate through the thickness of the second carrier tape.

8. A method according to claim 7, wherein the step of caulking said respective portions of the first and second projections comprises caulking the respective curved free end portions of said first and second inverted-J-shaped caulking projections that penetrate out of the respective other surfaces of the first and second carrier tapes, such that the curved free end portion of each of the first and second inverted-J-shaped caulking projections is bent in the corresponding direction having the component parallel to the widthwise direction of the flat main portion.

9. A method according to claim 1, wherein the step of causing said at least one first projection of the caulking projections to penetrate through the thickness of the first carrier tape, and said at least one second projection of the caulking projections to penetrate through the thickness of the second carrier tape, comprises causing two first inverted-J-shaped caulking projections which include respective curved free end portions curved in respective directions having respective components which are opposite to each other, to penetrate through the thickness of the first carrier tape, and causing two second inverted-J-shaped caulking projections which include respective curved free end portions curved in respective directions having respective components which are opposite to each other, to penetrate through the thickness of the second carrier tape.

10. A method according to claim 9, wherein the step of caulking said respective portions of the first and second projections comprises caulking the respective curved free end portions of said two first inverted-J-shaped caulking projections that penetrate out of the other surface of the first carrier tape, such that the respective curved free end portions of the two first inverted-J-shaped caulking projections are bent toward each other in the respective directions having the respective components opposite to each other, and simultaneously caulking the respective curved free end portions of said two second inverted-J-shaped caulking projections that penetrate out of the other surface of the second carrier tape, such that the respective curved free end portions of the two second inverted-J-shaped caulking projections are bent toward each other in the respective directions having the respective components opposite to each other.

11. A method according to claim 1, wherein the flat main portion has an elongate shape, the tape-feed holes of the flat main portion comprise three tape-feed holes, and the caulking projections comprise at least four caulking projections including two end projections which project from lengthwise opposite end portions of the elongate main portion, respectively, and two intermediate projections one of which projects from a first intermediate portion of the main portion between one pair of adjacent holes of the three tape-feed holes and the other of which projects from a second intermediate portion of the main portion between the other pair of adjacent holes of the three tape-feed holes, and wherein the step of causing said at least one first projection of the caulking projections to penetrate through the thickness of the first carrier tape, and said at least one second projection of the caulking projections to penetrate through the thickness of the second carrier tape, comprises causing one of the two end projections and a corresponding one of the two intermediate projections to penetrate through the thickness of the first carrier tape, and causing the other end projection and the other intermediate projection to penetrate through the thickness of the second carrier tape.

12. A method according to claim 11, wherein the step of caulking said respective portions of the first and second projections comprises caulking respective penetrating portions of said one end projection and said one intermediate projection that penetrate out of the respective other surfaces of the first and second carrier tapes, so that a distance between the respective penetrating portions of said one end projection and said one intermediate projection changes and a distance between the respective penetrating portions of said other end projection and said other intermediate projection changes.

13. A method according to claim 11, wherein the step of caulking said respective portions of the first and second projections comprises caulking respective penetrating portions of said one end projection and said one intermediate projection that penetrate out of the respective other surfaces of the first and second carrier tapes, so that a distance between the respective penetrating portions of said one end projection and said one intermediate projection decreases and a distance between the respective penetrating portions of said other end projection and said other intermediate projection decreases.

14. A method according to claim 1, wherein the step of causing said at least one first projection of the caulking projections to penetrate through the thickness of the first carrier tape, and said at least one second projection of the caulking projections to penetrate through the thickness of the second carrier tape, comprises causing at least one first Y-shaped caulking projection including a bifurcated free end portion including two arm portions, and at least one first inverted-J-shaped caulking projection including a curved free end portion curved in a direction having a component parallel to a widthwise direction of the flat main portion, to penetrate through the thickness of the first carrier tape, and causing at least one second Y-shaped caulking projection including a bifurcated free end portion including two arm portions, and at least one second inverted-J-shaped caulking projection including a curved free end portion curved in a direction having a component parallel to the widthwise direction of the flat main portion, to penetrate through the thickness of the second carrier tape.

15. A method according to claim 1, wherein the flat main portion has an elongate shape, the tape-feed holes comprises three tape-feed holes, and the caulking projections comprise eight caulking projections including four end projections first two of which project from one of lengthwise opposite end portions of the elongate main portion and second two of which project from the other lengthwise end portion of the elongate main portion, and including four intermediate projections first two of which project from a first intermediate portion of the main portion between one pair of adjacent holes of the three tape-feed holes and second two of which project from a second intermediate portion of the main portion between the other pair of adjacent holes of the three tape-feed holes, and wherein the step of causing said at least one first projection of the caulking projections to penetrate through the thickness of the first carrier tape, and said at least one second projection of the caulking projections to penetrate through the thickness of the second carrier tape, comprises causing said first two end projections and said first two intermediate projections to penetrate through the thickness of the first carrier tape, and causing said second two end projections and said second two intermediate projections to penetrate through the thickness of the second carrier tape.

16. A method according to claim 1, wherein the flat main portion has an elongate shape, and the caulking projections comprise at least four caulking projections including (a) two Y-shaped projections each of which includes a bifurcated free end portion and which project from lengthwise opposite end portions of the elongate main portion, respectively, and (b) two inverted-J-shaped projections each of which included a curved free end portion which is curved in a direction having a component parallel to a widthwise direction of the elongate main portion and which project from two intermediate portions of the main portion, respectively, which are apart from each other in a lengthwise direction thereof, and wherein the step of causing said at least one first projection of the caulking projections to penetrate through the thickness of the first carrier tape, and said at least one second projection of the caulking projections to penetrate through the thickness of the second carrier tape, comprises causing one of said two Y-shaped projections and a corresponding one of said two inverted-J-shaped projections to penetrate through the thickness of the first carrier tape, and causing the other Y-shaped projection and the other inverted-J-shaped projection to penetrate through the thickness of the second carrier tape.

17. A method according to claim 1, wherein the flat main portion has an elongate shape, and the caulking projections comprise eight caulking projections including (a) four Y-shaped projections each of which includes a bifurcated free end portion, first two of which project from one of lengthwise opposite end portions of the elongate main portion, and second two of which project from the other lengthwise end portion of the main portion, and including (b) four inverted-J-shaped projections each of which includes a curved free end portion which is curved in a direction having a component parallel to a widthwise direction of the elongate main portion, first two of which project from one of two intermediate portions of the main portion which are apart from each other in a lengthwise direction thereof, and second two of which project from the other intermediate portion of the main portion, and wherein the step of causing said at least one first projection of the caulking projections to penetrate through the thickness of the first carrier tape, and said at least one second projection of the caulking projections to penetrate through the thickness of the second carrier tape, comprises causing said first two Y-shaped projections and said first two inverted-J-shaped projections to penetrate through the thickness of the first carrier tape, and causing said second two Y-shaped projections and said second two inverted-J-shaped projections to penetrate through the thickness of the second carrier tape.

* * * * *